Feb. 23, 1971 D. E. MORRIS 3,566,307
UNIJUNCTION TRANSISTOR TIME DELAY CIRCUIT
Filed Feb. 9, 1968

INVENTOR.
Dustin E. Morris
BY
Mueller, Aichele & Rauner
ATT'Y.

United States Patent Office 3,566,307

Patented Feb. 23, 1971

3,566,307
UNIJUNCTION TRANSISTOR TIME DELAY CIRCUIT

Dustin E. Morris, Tempe, Ariz., assignor to Motorola, Inc., Franklin Park, Ill., a corporation of Illinois Filed Feb. 9, 1968, Ser. No. 704,328
Int. Cl. H03k 3/26
U.S. Cl. 331—111 9 Claims

ABSTRACT OF THE DISCLOSURE

Disclosed in a unijunction transistor (UJT) time delay circuit wherein a unijunction transistor is charged to its peak voltage $V_p$ by a field-effect transistor and is thereafter fired by a capacitor which is charged from a constant current source. The capacitor may be charged at variable rates and during long time durations if desired to fire the unijunction transistor.

BACKGROUND OF THE INVENTION

This invention relates generally to electronic timing circuits and more particularly to a solid-state unijunction transistor timing circuit which may be operated at very long duration time delays.

Unijunction transistors have been frequently used in prior art oscillator and time delay circuits, and in these circuits the UJT's have been commonly connected to respond to a charging voltage such as the voltage across the capacitor. When the capacitor voltage reaches the peak point voltage $V_p$ of the UJT, the UJT fires and discharges the capacitor. However, these prior art UJT circuits have the disadvantage that they will not operate at very long time delays. In addition, the current available for firing the UJT's at the end of the longest time delays attainable is not sufficiently large to properly fire the UJT.

SUMMARY OF THE INVENTION

An object of the present invention is to provide a new and improved solid-state time delay circuit having a wide variety of time delay applications.

Another object of this invention is to provide a new and improved unijunction transistor timing circuit operable at very long duration time delays.

A further object of this invention is to provide a novel, solid-state time delay circuit of the type described wherein ample firing current $I_p$ is available at the peak voltage $V_p$ to fire a unijunction transistor at the end of relatively long intervals during which the UJT is nonconductive.

Briefly described, the present invention features a time delay circuit including a unijunction transistor connected to a field-effect transistor, and this field-effect transistor provides leakage current to the unijunction transistor before it is fired. A charge storage means such as a capacitor is coupled to the unijunction transistor and is further connected to receive a constant charging current from a current source for charging up to a voltage sufficient to fire the unijunction transistor. The UJT fires at time intervals which may be varied with the value of capacitor charging current, and this current is variable in accordance with variable resistance at the current source.

These and other objects and features of this invention will become more readily understood from the following description of the accompanying drawings wherein:

IN THE DRAWINGS

DESCRIPTION OF THE PRIOR ART AND THE INVENTION

Figure 1:
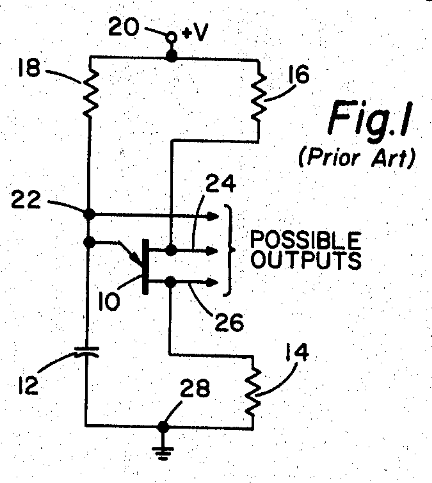
FIG. 1 is a prior art relaxation-type oscillator employing a unijunction transistor.

Referring in detail to the drawings, there is shown in FIG. 1 the basic building block of most unijunction timing and oscillator circuits. The relaxation oscillator in FIG. 1 includes unijunction transistor 10 having base one and base two electrodes 26 and 24 respectively. Resistors 14 and 16 serially connect the unijunction transistor between a voltage supply terminal 20 and ground potential 28. A capacitor 12 is connected between the emitter of the UJT 10 and ground potential, and a charging resistor 18 is connected between the emitter of the UJT 10 and the voltage supply terminal 20. In operation, capacitor 12 charges through resistor 18 until a peak voltage $V_p$ is reached and which is sufficient to fire the UJT 10.

To achieve a long time delay when using the circuit of FIG. 1, both the charging resistor 18 and the capacitor 12 should be large. In addition, for good accuracy and repeatability the capacitor 18 leakage current must be much less than the charging current. Since capacitors with extremely low leakage required for accuracy and repeatability are relatively expensive in large sizes, it is preferable to increase the charging resistance of resistor 18. However, this strategy soon runs into the limitation of insufficient current at the peak voltage $V_p$ to actually fire the unijunction transistor 10. Any resistance in series with the capacitor 12 reacts against firing the unijunction transistor 10 since the current through the resistor 18 is a minimum just as the unijunction starts to turn on with the capacitor 12 charged up to its maximum value.

If the charging current for capacitor 12 is constant, the period of oscillation can be made quite long and still provide enough current to fire the unijunction transistor 10. The prior art circuit shown in FIG. 2 has been designed to this end and includes a field-effect transistor (FET) 30 connected between a voltage supply terminal 20 and a capacitor 12. The FET 30 provides a constant charging current through resistor 32, e.g., 1 microamp, into capacitor 12 and insures time delays of up to 10 minutes. A microamp charging current is more than adequate for firing the annular unijunction transistor 10. However, when using the circuit in FIG. 2, the time intervals between the turn on of the UJT 10 are still limited because a constant charging current of only a few tenths of a microamp does not provide UJT firing time intervals over a maximum of approximately one hour.

Figure 2:
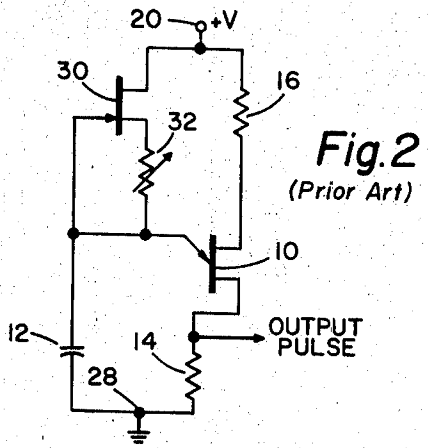
FIG. 2 is a prior art time delay circuit featuring constant current charging of a capacitor.
Figure 3:
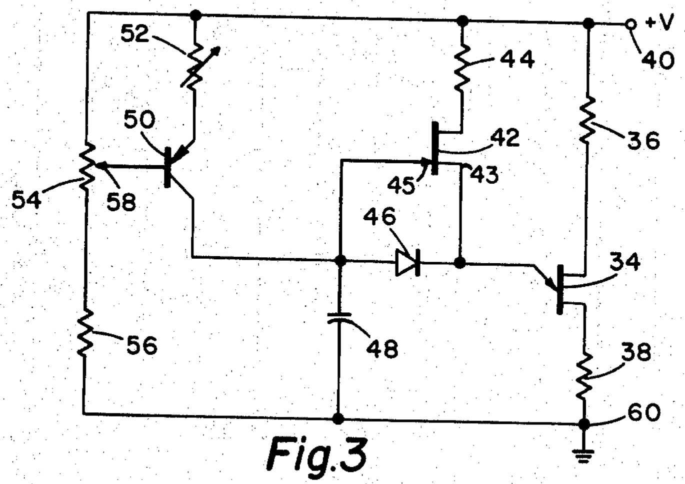
FIG. 3 is a schematic diagram of an embodiment of the present invention.

Therefore, the present invention illustrated in FIG. 3 has been constructed to overcome the above-described disadvantages of the prior art circuits in FIGS. 1 and 2. The time delay circuit in FIG. 3 includes both a means for charging the capacitor 48 therein as well as a separate means for providing adequate firing current for in unijunction transistor 34. In addition to the UJT 34, the circuit in FIG. 3 includes a resistor 36 which serially connects one base of the UJT 34 to a voltage supply terminal 40 and another resistor 38 which connects the other base of the UJT 34 to a point 60 of reference or ground potential. A means for providing current to the UJT 34, both before and after firing, comprises a source follower field-effect transistor 42 connected via resistor 44 to voltage supply terminal 40. A charge storage means in the form of capacitor 48 for firing UJT 34 is connected to receive a constant charging current from transistor 50. Diode 46 is connected between capacitor 48 and the emitter of UJT 34 to prevent the capacitor 48 from discharging through the source follower 42.

In addition to PNP transistor 50, the capacitor charging means of FIG. 3 includes resistor 52 which is connected between the emitter of transistor 50 and a voltage supply terminal 40 and also includes resistors 54 and 56 which are connected between terminal 40 and a point of reference potential 60. Resistor 54 has a movable tap 58 thereon for varying the base potential on transistor 50 and for establishing the charging current into capacitor 48. Resistor 54 can be used as a calibrating resistor for resistor 52 as will be explained in more detail below.

OPERATION

The circuit in FIG. 3 includes a source of current $I_c$ for charging the capacitor 48 and a different source of current $I_p$ for firing the UJT 34, and the charging circuitry including transistor 50 charges the capacitor 48 independently of current $I_p$ flowing in the source follower FET 42. Charging PNP transistor 50 is part of a constant current source for the capacitor 48, and the tap 58 on resistor 54 may be adjusted so that the capacitor 48 will charge slowly and take as long as 24 hours or longer to reach a voltage sufficiently large to fire the UJT 34. During this time, the FET source follower 42 is conducting and provides an increasing leakage current to the UJT 34 prior to the time that capacitor 48 charges to a voltage sufficiently high to fire UJT 34. FET 42 is operated in the depletion mode, and the source electrode 43 is approximately 1 volt higher than the gate electrode 45. Thus, the PN junction between source electrode 43 and gate electrode 45 is always reverse biased to a value which limits the channel current through the FET 42 to the value of the FET leakage current.

Figure 4:
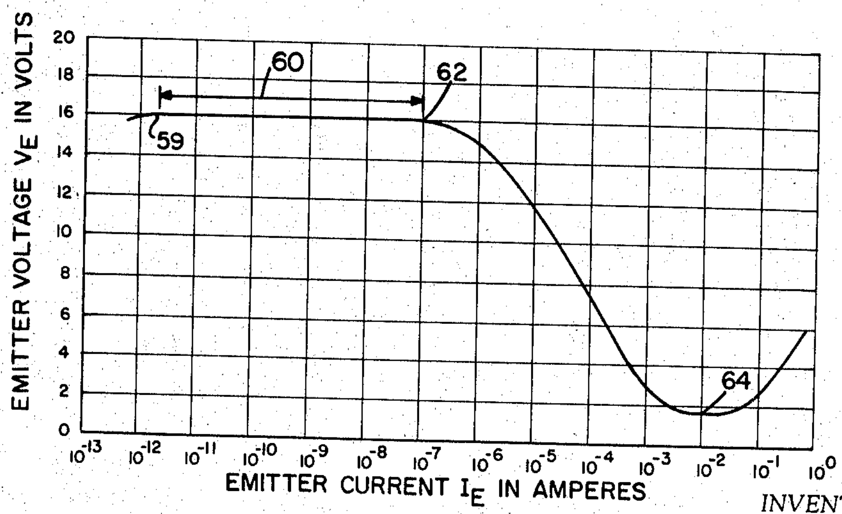
FIG. 4 is a graph of emitter voltage vs. emitter current for the unijunction transistor in FIG. 3.

After a time interval determined by the value of charging current $I_c$ into capacitor 48, the capacitor 48 drives the emitter voltage of the UJT 34 to its peak value $V_p$. When the $V_p$ is reached the emitter voltage $V_e$ of the UJT 34 will drop to a low value as shown in FIG. 4, and discharge capacitor 48 through diode 46. The forward diode drop across diode 46 is less than the forward diode drop of the gate-source junction of FET 42. Diode 46 thus protects the gate-source junction of FET 42 from excessive current.

As the UJT fires, FET 42 is momentarily forward biased and resistor 44 limits the current flow through the source follower to a value sufficiently low to prevent latch up of the UJT 34. When capacitor 48 has discharged through diode 46 and into the emitter of UJT 34, the timing cycle will begin once again with the recharging of capacitor 48. Thus, the source follower FET 42 serves to separate the functions of charging the capacitor 48 and providing leakage and firing current $I_p$ to the UJT 34.

The graph in FIG. 4 will further illustrate the function of the source follower 42 in firing the UJT 34. When the circuit in FIG. 3 is energized by the application of a supply voltage at terminal 40, the FET 42 will begin to conduct current (UJT leakage current only at this point) into the emitter of the UJT 34 and thereby develop an emitter voltage on UJT 34. Such emitter voltage is reached at point 59 on the characteristic curve in FIG. 4. It is seen from FIG. 4 that the UJT peak point voltage $V_p$ of approximately 16 volts is reached at a forward emitter current of about 10 picoamperes, and this voltage $V_p$ remains constant until the emitter current reaches approximately 0.1 microamperes at point 62 on the curve. In the range 60 shown between point 59 at which $V_p$ is initially reached and point 62 at which the emitter voltage begins to decline, the peak point voltage $V_p$ is constant at approximately 16 volts. At point 62 the UJT emitter current begins to fall as shown to a valley voltage at point 64 of approximately 1.6 volts and at a corresponding current of approximately 8 milliamperes.

The time delay circuit in FIG. 3 has a wide variety of applications and has been used for time delays up to 40 hours with an 80% accuracy. However, for time durations in the order of 10 hours, an accuracy of 95% has been achieved. Such time delays represent a substantial advance in the art when compared to the time delay circuit in FIG. 2 which can only time up to periods in the order of one hour or less.

The variable resistor 52 can be conveniently used to vary the timing cycle of the circuit in FIG. 3 and the tap point 58 on the resistor 54 can be used to calibrate the scale for the variable resistor 52. For example, if the voltage E is in the order of 1.7 volts, then the voltage across the ten megohm resistor 52 will be approximately 1 volt and the current flowing into the emitter of transistor 50 will be approximately one microampere. If transistor 50 has a high beta, the charging current for capacitor 48 will be approximately 1 microampere. If, however, the tap point 58 on resistor 54 were moved up to increase the value of E to 10.7 volts, for example, then the emitter current and collector current of the PNP transistor 50 would be increased by an order of magnitude. In this manner, the calibration of a dial or the like which is used to control the variable resistor 52 could likewise be changed by an order of magnitude.

The following table lists values of components which were used in a circuit of the type shown in FIG. 3 which was actually built and successfully operated. However, said table should not be construed as limiting the scope of this invention.

TABLE

| Component: | | Value |
|---|---|---|
| Resistor (R): | | |
| R36 | kilohm | 1 |
| R38 | ohms | 27 |
| R44 | kilohms | 22 |
| R52 | megohms | 10 |
| R54 | kilohm | 1 |
| R56 | do | 1 |
| Capacitor **48** | microfarads | 10 |
| Supply voltage (terminal **40**) | volts | 25 |
| | | Type |
| Diode **46** | | 2N4125 |
| Transistor **50** | | 2N4125 |
| FET **42** | | 2N4220 |
| UJT **34** | | 2N4853 |

Accordingly, the invention described above is limited only by way of the following claims.

I claim:

1. A timing circuit including, in combination, a unijunction transistor having an emitter and a pair of base electrodes, a capacitor having terminals connected between the emitter and one of the base electrodes of said unijunction transistor, charging means connected across said capacitor for charging said capacitor, a field-effect transistor having a pair of main electrodes and a gate electrode, means for connecting a voltage source to said emitter by the way of the main electrodes of said field-effect transistor whereby current for said unijunction transistor is provided by way of said field-effect transistor, means to connect the other base of said unijunction transistor to said voltage source, and a connection from the gate of said field-effect transistor to the terminal of said capacitor to which said emitter is connected, whereby said capacitor charges to such a potential that the emitter of said unijunction transistor is at its firing potential and said field-effect transistor provides firing current for the emitter of said unijunction transistor.

2. The invention of claim 1 in which a diode is connected between a terminal of said capacitor and the emitter of said unijunction transistor, said diode providing a discharge path for said capacitor when said unijunction transistor is fired.

3. The circuit defined in claim 2 wherein:

said charging means includes a charging transistor connected between said voltage supply terminal and said capacitor, said charging transistor provides an output current to charge the capacitor at a rate determined by the biasing of said transistor, and variable resistance means connected between said transistor and said voltage supply terminal for adjusting the bias on said charging transistor in order to provide a desired charging current to said capacitor.

4. The circuit defined in claim 3 which further includes:

a first resistor connected between one base of said unijunction transistor and said voltage supply terminal, a second resistor connected between another base of said unijunction transistor and a point of reference potential, a third resistor connected between the drain electrode of said field-effect transistor and said voltage supply terminal, said variable resistance means includes a fourth, variable resistor connected between the emitter of said charging transistor and said voltage supply terminal, a fifth resistor connected between said voltage supply terminal and the base of said charging transistor, said fifth resistor having a variable tap thereon for adjusting the base potential on said charging transistor, a sixth resistor connected between said fifth resistor and said point of reference potential, and said diode connected between the source and gate electrodes of said field-effect transistor for preventing said capacitor from discharging through said field-effect transistor when the voltage on said capacitor reaches a predetermined level.

5. A timing circuit including, in combination:

a unijunction transistor connected between a voltage supply terminal and a point of reference potential, a field-effect transistor connected between said voltage supply terminal and the emitter of said unijunction transistor, said field-effect transistor having its gate electrode connected to said emitter of said unijunction transistor, and providing thereto a current both prior to and after firing of said unijunction transistor, a capacitor connected between said point of reference potential and the emitter of said unijunction transistor and operative to charge to a voltage sufficient to fire said unijunction transistor, constant current charging means connected between said voltage supply terminal and said capacitor for providing a constant charging current to said capacitor to charge up said capacitor and fire said unijunction transistor at time intervals proportional to the value of charging current into said capacitor.

6. The circuit defined in claim 5 which further includes a diode connected between said capacitor and said unijunction transistor and further connected in parallel with source and gate electrodes of said field-effect transistor for providing a discharge path from said capacitor to said unijunction transistor.

7. The circuit defined in claim 6 wherein said charging means includes:

a charging transistor connected to said capacitor and further connected through variable resistance means to said voltage supply terminal, said variable resistance means being adjustable to vary the bias on said charging transistor and thereby vary the charging current to said capacitor in accordance with a desired time delay prior to firing said unijunction transistor.

8. The circuit defined in claim 7 wherein said variable resistance means includes a variable resistor connected between the emitter of said charging transistor and said voltage supply terminal, said variable resistor being adjustable to vary the emitter current of said charging transistor, and a resistor connected between said voltage supply terminal and a point of reference potential and having a variable tap thereon connected to the base of said charging transistor for varying the base current of said charging transistor.

9. The circuit defined in claim 8 which further includes:

a first resistor connected between one base of said unijunction transistor and said voltage supply terminal, a second resistor connected between the other base of said unijunction transistor and said point of reference potential, a third resistor connected between the drain of said field-effect transistor and said voltage supply terminal, and a fourth resistor connected between said variable tap at the base of said charging transistor and said point of reference potential.

References Cited

UNITED STATES PATENTS

| | | | |
|---|---|---|---|
| 3,048,708 | 8/1962 | Raver | 307—273X |
| 3,130,378 | 4/1964 | Cook, Jr. | 331—111 |
| 3,335,332 | 8/1967 | Zdzieborski | 307—301X |
| 3,427,562 | 2/1969 | Lajoic et al. | 331—111 |
| 3,447,099 | 5/1969 | Lockshaw | 331—111 |

DONALD D. FORRER, Primary Examiner

R. C. WOODBRIDGE, Assistant Examiner

U.S. Cl. X.R.

307—246, 251, 293, 301, 304